United States Patent
Muralidhar et al.

(10) Patent No.: US 6,297,095 B1
(45) Date of Patent: Oct. 2, 2001

(54) MEMORY DEVICE THAT INCLUDES PASSIVATED NANOCLUSTERS AND METHOD FOR MANUFACTURE

(75) Inventors: Ramachandran Muralidhar; Chitra K. Subramanian; Sucharita Madhukar, all of Austin; Bruce E. White, Round Rock; Michael A. Sadd, Austin; Sufi Zafar, Austin; David L. O'Meara, Austin; Bich-Yen Nguyen, Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/596,399

(22) Filed: Jun. 16, 2000

(51) Int. Cl.[7] .................................................. H01L 21/336
(52) U.S. Cl. ........................................... 438/257; 438/197
(58) Field of Search ............................. 438/97, 197, 211, 438/257, 263, 264, 265, 680, 266, 165, 166, 491, 594, 770, 775

(56) References Cited

U.S. PATENT DOCUMENTS

| | | | |
|---|---|---|---|
| 5,886,368 | * 3/1999 | Forbes et al. | 257/77 |
| 6,090,666 | * 7/2000 | Ueda et al. | 438/257 |
| 6,140,181 | * 10/2000 | Forfes et al. | 438/257 |
| 6,166,401 | * 12/2000 | Forbes | 257/77 |

OTHER PUBLICATIONS

Wahl et al., "Write, Erase and Storage Times in Nanocrystal Memories and the Role of Interface States," IEEE, pp. 15.4.1–15.4.4 (1999).

Kim, et al. "Room Temperature Single Electron Effects in Si Quantum Dot Memory with Oxide–Nitride Tunneling Dielectrics," IEEE, 4 pgs. (1998).

* cited by examiner

Primary Examiner—David Nelms
Assistant Examiner—David Nhu
(74) Attorney, Agent, or Firm—James L. Clingan, Jr.

(57) ABSTRACT

A semiconductor memory device with a floating gate that includes a plurality of nanoclusters (21) and techniques useful in the manufacturing of such a device are presented. The device is formed by first providing a semiconductor substrate (12) upon which a tunnel dielectric layer (14) is formed. A plurality of nanoclusters (19) is then grown on the tunnel dielectric layer (14). After growth of the nanoclusters (21), a control dielectric layer (20) is formed over the nanoclusters (21). In order to prevent oxidation of the formed nanoclusters (21), the nanoclusters (21) may be encapsulated using various techniques prior to formation of the control dielectric layer (20). A gate electrode (24) is then formed over the control dielectric (20), and portions of the control dielectric, the plurality of nanoclusters, and the gate dielectric that do not underlie the gate electrode are selectively removed. After formation of spacers (35), source and drain regions (32, 34) are then formed by implantation in the semiconductor layer (12) such that a channel region is formed between the source and drain regions (32, 34) underlying the gate electrode (24).

17 Claims, 4 Drawing Sheets

MEMORY DEVICE THAT INCLUDES PASSIVATED NANOCLUSTERS AND METHOD FOR MANUFACTURE

CROSS-REFERENCES TO RELATED APPLICATIONS

Related subject matter is disclosed in U.S. application Docket No. SC 11076TP entitled "Memory Device and Method for Manufacture," U.S. application Docket No. SC10966TP entitled "Memory Device and Method for Using Prefabricated Isolated Storage Elements," and U.S. application Docket No. SC11074TP entitled "Memory Device Including Nanoclusters Deposited on a Modified Tunnel Dielectric Layer and Method for Manufacture," filed simultaneously herewith and assigned to the assignee hereof.

BACKGROUND OF THE INVENTION

1. Field of the Invention

The invention relates generally to semiconductor devices and more particularly to a semiconductor memory device and a process for forming such a semiconductor memory device.

2. Description of the Related Art

Electrically erasable programmable read only memory (EEPROM) structures are commonly used in integrated circuits for non-volatile data storage. As is known, EEPROM device structures commonly include a floating gate that has charge storage capabilities. Charge can be forced into the floating gate structure or removed from the floating gate structure using control voltages. The conductivity of the channel underlying the floating gate is significantly altered by the presence of charges stored in the floating gate. The difference in conductivity due to a charged or uncharged floating gate can be current sensed, thus allowing binary memory states to be determined. The conductivity difference is also represented by shift in the threshold voltage ($V_T$) associated with the device in the two different states.

As semiconductor devices continue to evolve, the operating voltages of such semiconductor devices are often reduced in order to suit low power applications. It is desirable for such operating voltage reductions to be accomplished while ensuring that the speed and functionality of the devices is maintained or improved. A controlling factor in the operating voltages required to program and erase devices that include floating gates is the thickness of the tunnel oxide through which carriers are exchanged between the floating gate and the underlying channel region.

In many prior art device structures, the floating gate is formed from a uniform layer of material such as polysilicon. In such prior art device structures, a thin tunnel dielectric layer beneath the floating gate presents the problem of charge leakage from the floating gate to the underlying channel through defects in the thin tunnel dielectric layer. Such charge leakage can lead to degradation of the memory state stored within the device and is therefore undesirable. In order to avoid such charge leakage, the thickness of tunnel dielectric is often increased. However, thicker tunnel dielectric requires higher (programming and erasing) voltages for storing and removing charge from the floating gate as the charge carriers must pass through the thicker tunnel dielectric. In many cases, higher programming voltages require the implementation of charge pumps on integrated circuits in order to increase the supply voltage to meet programming voltage requirements. Such charge pumps consume a significant amount of die area for the integrated circuit and therefore reduce the memory array area efficiency and increase overall costs.

In order to reduce the required thickness of the tunnel dielectric and improve the area efficiency of the memory structures by reducing the need for charge pumps, the uniform layer of material used for the floating gate may be replaced with a plurality of nanoclusters, which operate as isolated charge storage elements. Such nanoclusters are also often referred to as nanocrystals, as they may be formed of silicon crystals. In combination, the plurality of nanoclusters provide adequate charge storage capacity while remaining physically isolated from each other such that any leakage occurring with respect to a single nanoclusters via a local underlying defect does not cause charge to be drained from other nanoclusters (by controlling average spacing between nanoclusters, it can be ensured that there is no lateral charge flow between nanoclusters in the floating gate). As such, thinner tunnel dielectrics can be used in these device structures. The effects of leakage occurring in such thin tunnel dielectric devices does not cause the loss of state information that occurs in devices that include a uniform-layer floating gate.

A limiting factor in fabrication of devices that include floating gates made up of a plurality of nanoclusters relates to controlling of the size, density, and uniformity of the nanoclusters within the floating gate structure. The density of the nanoclusters is important in the determination of the change in the threshold voltage for the device between the states where the floating gate is charged or discharged. Higher densities are desirable as they lead to an increased change in threshold voltage when the density of charges per storage element is fixed. Prior art techniques for forming nanoclusters on the oxide tunnel dielectric were limited to a density of approximately $5 \times 10^{11}$ nanoclusters per cm$^2$. With such a limited density of isolated storage elements, the charge density per nanocluster, or number of carriers that each nanocluster must retain, is forced to an elevated level. The higher storage density per nanocluster typically leads to charge loss from individual nanoclusters, thus degrading the overall charge retention characteristics of the floating gate. In addition to this limitation, lower nanocluster densities require longer programming times as a longer time period is required for forcing subsequent charge carriers into each nanocluster after an initial carrier has been stored. Furthermore, the time required for adding subsequent carriers continues to increase as the charge density per nanocluster is elevated.

In one prior art technique for forming nanoclusters, ion implantation is used to implant silicon atoms into a dielectric material. Following implantation, an annealing step causes these implanted silicon atoms to group together through phase separation to form the nanoclusters. Problems arise using such a technique due to the difficulty in controlling the depth at which the silicon nanoclusters are formed due to the phase segregation in the dielectric material. Because the depth at which the isolation storage elements are formed dramatically affects the electrical characteristics of the resulting device, ion implantation does not provide the level of control desired in a manufacturing situation.

In another prior technique for forming the nanoclusters, a thin layer of amorphous silicon is deposited on the tunnel dielectric material. A subsequent annealing step is used to recrystalize the amorphous silicon into the nanoclusters. In order to produce nanoclusters of a desired density and size, the layer of amorphous silicon should be deposited such that it is on the order of 7–10 angstroms in thickness. Deposition of such thin layers of amorphous silicon is hard to control and therefore impractical in a manufacturing process. In addition to such control issues, additional problems may arise due to preexisting crystalline zones within the amorphous silicon layer. Such preexisting crystallites serve as nucleation sites for crystal growth, which deleteriously interferes with the spontaneous crystal growth desired for formation of the nanoclusters.

In other prior techniques for forming nanoclusters, chemical vapor deposition (CVD) techniques such as low pressure chemical vapor deposition (LPCVD) are used to nucleate and grow the nanoclusters directly on the tunnel oxide. Such prior art LPCVD techniques typically involve a very short deposition time period, on the order of approximately 10–30 seconds. Part of this deposition time period includes an incubation period where an adequate number of silicon atoms are generated on the surface of the dielectric prior to the commencement of the clustering activity that forms the crystalline structures of the nanoclusters. The remaining portion of the time is used to nucleate and grow the nanoclusters to the desired size. Due to the fact that the time period associated with nucleation and growth is so short, slight deviations in the processing parameters have profound effects on the resulting density and size uniformity of the resulting nanoclusters. Moreover, systematic effects can be significant. For example, portions of a silicon wafer being processed that are near the source of the reactant gas may realize a much higher density and size of nanoclusters, whereas portions of the wafers that are more distant from the reactant gas source would see lower densities and smaller sizes of nanoclusters. Such process non-uniformities are undesirable in manufacturing processes.

Therefore, a need exists for a method for including nanoclusters within semiconductor devices in a manner that provides a high density of storage elements while maintaining control over the size dispersion of the storage elements.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention pertains to a semiconductor memory device with a floating gate that includes a plurality of nanoclusters and techniques useful in the manufacturing of such a device. The device is formed by first providing a semiconductor substrate upon which a tunnel dielectric layer is formed. A plurality of nanoclusters is then grown on the tunnel dielectric layer. After growth of the nanoclusters, a control dielectric layer is formed over the nanoclusters. In order to prevent oxidation of the formed nanoclusters, the nanoclusters may be encapsulated or passivated prior to formation of the control dielectric layer. Such encapsulation may include forming a thin layer of nitride on the nanoclusters. A gate electrode is then formed over the control dielectric, and portions of the control dielectric, the plurality of nanoclusters, and the gate dielectric that do not underlie the gate electrode are selectively removed. After formation of spacers, source and drain regions are formed by implantation in the semiconductor layer such that a channel region is formed between the source and drain regions underlying the gate electrode.

By forming the floating gate of the semiconductor device using nanoclusters that are grown through a controlled LPCVD, RTCVD, or UHCVD process, the density of nanoclusters included in the floating gate structure can be closely controlled. Within the specification, references to LPCVD processing describe processing that may be performed using LPCVD or RTCVD processing techniques. In embodiments utilizing LPCVD techniques, a multistep process may be utilized to ensure proper nucleation and growth selectivity for different phases of the nanocluster formation. As such, desired nanocluster densities can be achieved while ensuring uniformity in size and density in a manufacturable process. In embodiments where UHVCVD is utilized to grow the nanocluster structures, additional advantages are achieved due to the reduction in background contamination in the environment within which the nanocluster formation occurs. Similar optimizations to the formation of the nanoclusters that were utilized in LPCVD techniques can be employed in UHVCVD techniques to produce the desired resulting nanocluster structures. In UHVCVD techniques, even lower pressures than those present in LPCVD techniques can provide a further reduction in growth kinetics such that a higher level of control is obtained over the nanocluster formation. Furthermore, potential gradients in nanocluster growth rates due to precursor gas depletion effects are further minimized.

Figure 1:
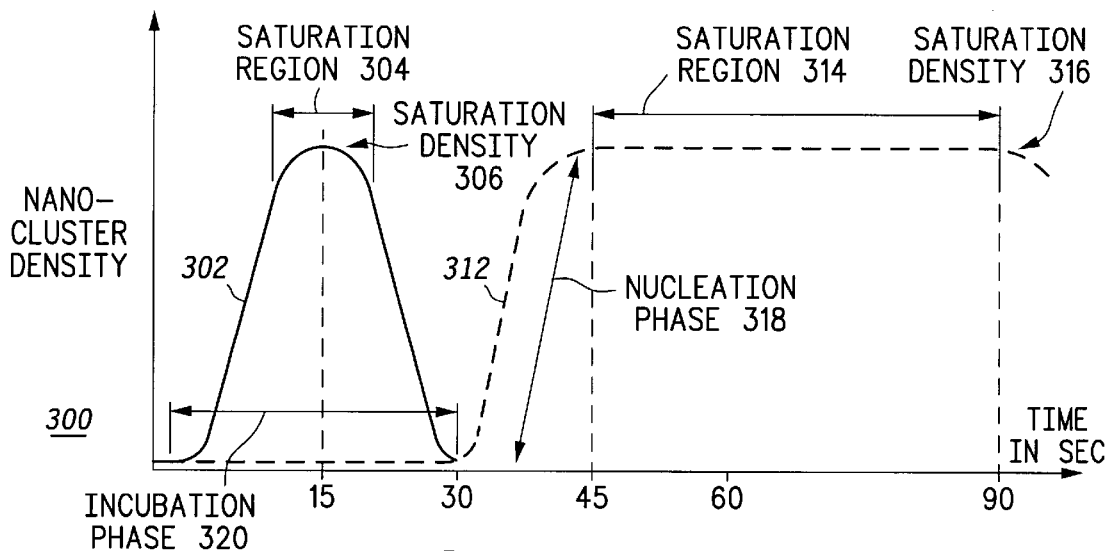
FIG. 1 includes a graph that illustrates curves associated with nanocluster formation, where such curves plot nanocluster density versus time during CVD processing.

The invention can be better understood with reference to FIGS. 1–28. FIG. 1 illustrates a graph that shows the general evolution of the nanoclusters during the nucleation and growth phases as a function of time. Two curves 302 and 312 are illustrated in FIG. 1. The curve 302 corresponds to nanocluster development consistent with prior art techniques in which higher temperatures and shorter growth time periods produced through a single step deposition process resulted in a limited level of control over nanocluster growth. The parameters associated with such prior art techniques provide a lack of control of the selectivity of nucleation to growth with regard to nanocluster formation during all phases of the one step process to which the curve 302 corresponds.

The curve 302 corresponding to the prior art deposition technique begins with a brief incubation phase where silicon atoms begin to be deposited on the tunnel dielectric layer. Once enough silicon atoms have been deposited on the dielectric material, nucleation begins to occur. Due to the fact that higher temperatures are used in conjunction with the prior art technique, the surface diffusion rate of silicon atoms present on the dielectric layer will be higher than that in a lower temperature environment. The size of the stable critical nucleus is also higher at the higher deposition temperature. The growth of the already formed nuclei is also higher at the higher temperature. At higher temperatures, the silicon atoms arriving on the surface of the dielectric must move through a longer diffusion distance before they are either captured by an already existing nucleus or they combine with other diffusing silicon atoms to form a stable nucleus. The probability of capture of a silicon atom by an existing nucleus is higher at higher temperature due to longer diffusion distances, hence the growth rate of nuclei dominates the nucleation rate. This type of limited nucleation and rapid growth is undesirable as it results in smaller numbers of large nanoclusters.

Once the saturation region 304 on the curve 302 has been passed, these large nanoclusters continue to grow and begin to merge together such that the resulting density of nanoclusters is less than the maximum saturation density 306 associated with the curve 302. Note that the plateau of the curve 302 has a relatively brief time period where the saturation density is achieved. The higher temperatures corresponding to the curve 302 result in a greatly reduced time period during which the initial nucleation and subsequent growth of the nanoclusters occurs, thus reducing the level of control for the overall nanocluster development. Furthermore, slight deviation from the times associated with nanocluster growth corresponding to the curve 302 can result in much more significant variations of the nanocluster density and size.

The curve 312 corresponds to nanocluster development in accordance with a portion of the teachings provided herein. Such teachings provide a lower temperature process that results in a much greater level of control over nanocluster nucleation and growth. As such, the nanocluster development can be performed as a multi-step process rather than a single, hard to control step. Following the incubation phase 320 corresponding to the curve 312, a highly selective nucleation phase 318 occurs. The nucleation phase 318 allows for a high nucleation-to-growth ratio with respect to nanocluster formation on the tunnel dielectric surface. As such, silicon atoms (or atoms of other materials used to form the nanoclusters) present on the tunnel dielectric surface are much more likely to form nuclei than they are to attach to pre-existing nuclei, which would result in growth. The conditions that favor such a selective nucleation phase include low temperatures and higher partial pressures of the reactant gas. Note that the temperature should not be so low as to become reaction limited. Thus, during the nucleation phase (a first phase), a plurality of critical nuclei (nuclei large enough to remain stable) is formed.

Following the nucleation phase 318, a saturation region 314 that is much longer than that associated with prior art nanocluster formation techniques allows for controlled growth of the nucleated nanocluster structures. During this second, or growth phase, the critical nuclei are grown into nanoclusters. The control present during the saturation region 314 enables nanoclusters of the desired size to be formed uniformly across the surface of the tunnel dielectric layer covering the substrate. Due to the fact that the saturated region 314 is relatively lengthy in time, the optimal saturation density 316 may be achieved in a manufacturing environment. Thus, deviations with respect to the time period over which the nanocluster growth occurs will have less of an effect on the resulting density of nanoclusters on the tunnel dielectric.

Once saturation has been achieved, factors that are important for prolonging the saturation region 314 include lower partial pressures of the precursor gas and a temperature greater than or equal to the temperature of nucleation. Thus, the factors that elevate the growth rate during the saturation region 314 also decrease the nucleation rate normally associated with the nucleation phase 318. As such, the deposition of the nanoclusters on the dielectric layer is divided into a two-step process, where each step can be individually controlled to achieve the desired result.

It should be noted that the times associated with the curves illustrated in FIG. 1 are merely provided as examples, and are not to be construed as limiting. Thus, the time period associated with the nucleation and growth phases of the curve 312 may be modified based on alterations to the conditions present during the different deposition phases. As is apparent to one of ordinary skill in the art, higher temperatures will reduce the time periods associated with each of the phases when the partial pressures are maintained at a constant level. Similarly, higher pressures will reduce the time periods associated with the various phases when the temperature is held constant.

Figure 2:
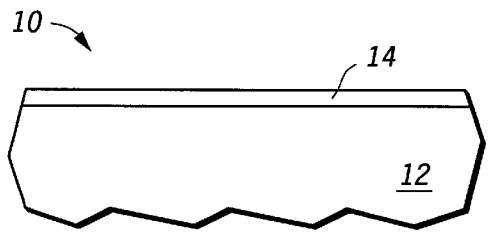
FIG. 2 illustrates a cross-sectional view of a portion of a semiconductor substrate that includes a formed layer of tunnel dielectric.

FIG. 2 illustrates a cross-sectional view of a portion of a semiconductor substrate 10 that includes a semiconductor layer 12. The semiconductor layer 12 may be silicon. A tunnel dielectric layer 14, which may also be referred to as tunnel oxide, has been formed overlying the semiconductor layer 12. The tunnel dielectric layer 14 may be silicon dioxide, silicon oxynitride, or other high dielectric constant (high-K) materials. The tunnel dielectric layer 14 may be thermally grown or deposited. The thickness of the tunnel dielectric layer 14 may be on the order of less than 50 angstroms. In the case where the device formed is used in more volatile memory structures, thinner tunnel dielectric layers, such as those on the order of 15–20 Angstroms may be used.

In order to facilitate formation of nanoclusters on the surface of the tunnel dielectric layer 14, the surface of the tunnel dielectric layer 14 can be modified to promote nucleation of nanocluster structures. In other words, the surface structure can be modified such that critical nucleus size, surface diffusion of silicon atoms is reduced, and the reactant byproducts desorption is increased.

Figure 3:
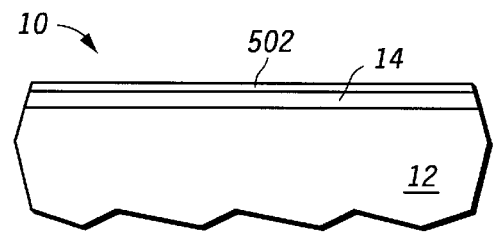
FIG. 3 illustrates a cross-sectional view of the portion of the semiconductor substrate of FIG. 2 following formation of an overlying nitrogen-containing layer in accordance with a particular embodiment of the present invention.

FIG. 3 illustrates one technique for altering the surface of the tunnel dielectric layer 14 in order to promote nucleation. Note that the alteration of the surface of the tunnel dielectric layer 14 may also be helpful in the deposition of pre-formed nanoclusters, as described in a co-pending patent application entitled "MEMORY DEVICE AND METHOD FOR USING PREFABRICATED ISOLATED STORAGE ELEMENTS" having an attorney docket number of SC10966TP that was filed on the same day as the present application and is incorporated herein by reference. FIG. 3 illustrates a cross sectional view of the portion of the semiconductor substrate 10 where a nitrogen-containing layer 502 has been formed over the tunnel dielectric layer 14. The nitrogen-containing layer 502 may include nitride ($Si_3N_4$) or silicon oxynitride ($SiO_xN_y$). Both nitride and silicon oxynitride change the surface structure of the tunnel dielectric such that nucleation is promoted. Such nucleation promotion includes a reduction in the size of a critical nucleus in terms of number of atoms, a decrease in the surface diffusion rate that promotes nucleation of nanoclusters, an increase in the surface reaction such that undesired byproducts resulting from nanocluster formation are desorbed more rapidly from the surface, and an improved adhesion of the atoms comprising the nanoclusters to the substrate surface.

The nitrogen-container layer 502 may be formed by CVD processes such as LPCVD or UHVCVD, and the nitrogen-containing layer 502 may be in direct contact with the tunnel dielectric layer 14. UHVCVD of the nitrogen-containing layer may be more controllable than LPCVD as the UHVCVD generally occurs more slowly and therefore the growth rate may be more closely regulated. The nitrogen-containing layer may be a result of deposition from the reaction of such gases as silane (or other silicon source precursor such as dichlorosilane, or disilane) and ammonia (or other nitrogen species such as plasma-ionized nitrogen, $N_2O$ or NO) or a surface reaction to a reacting gas such as ammonia (or other nitrogen species such as plasma-ionized nitrogen, $N_2O$ or NO). Dichlorosilane and ammonia gas in combination with a co-flow of some inert gas and oxygen-containing gas may be used for growth of the nitrogen-containing layer 502. Once a thin nitrogen-containing layer has been formed on the surface of the tunnel dielectric layer 14, penetration of nitrogen into the underlying tunnel dielectric layer 14 will generally be impeded such that contamination of the tunnel dielectric layer 14, which may result in leakage, is avoided.

The thickness of the nitrogen-containing layer 502 is preferably limited to ensure that carrier traps included in nitride structures do not dominate the charge storage aspects of the semiconductor device being formed. In one embodiment, a desired thickness for the nitrogen-containing layer is less than 10 angstroms. In other embodiments, the desired thickness may be 5 angstroms or less. Utilizing thin nitrogen-containing layers ensures that the long term charge retention characteristics of memory devices formed using floating gate structures that include nanoclusters will meet desired specifications. Thicker nitrogen-containing layers, such as those on the order of 20 or more angstroms, may be undesirable as the charge retention characteristics of the resulting device may be compromised through the limited charge retention characteristics of the nitrogen-containing layer. This is because the nitrogen-containing layer will trap some of the carriers intended to be stored within the nanocluster structures. Such trapped carriers in the nitride level can dominate the overall charge retention characteristics of the resulting device. Furthermore, the inclusion of thicker nitrogen-containing layers, such as those greater than or equal to 20 angstroms, may increase the time associated with forcing carriers into the nanocluster structures as the traps capture some of the carriers en route.

For devices that include nanocluster densities of at least $10^{12}$ nanoclusters per $cm^2$, it has been determined that nitrogen-containing layers that are 10 angstroms or less in thickness are acceptable. In some embodiments, the nitride layer may be less than or equal to 7 angstroms. The thickness of the nitrogen-containing layer should be at least that required to ensure generally uniform coverage of the tunnel dielectric layer 14 by the nitrogen-containing layer 502 such that uniform nanocluster deposition occurs. Therefore, in some embodiments, the thickness of the nitride layer is greater than or equal to 3 angstroms such that an acceptable nitride thickness range may be between 3 and 7 angstroms.

In the case where silicon oxynitride is utilized as the nitrogen-containing layer 502, the concentration of nitrogen within the silicon oxynitride may be greater than 5%. The percentage concentration of nitrogen included in the silicon oxynitride can be controlled such that the trade-off between the saturation density of nanoclusters that can be formed on the surface and the inclusion of traps due to nitride concentration is regulated.

Figure 4:
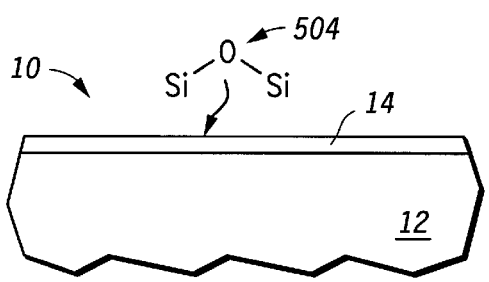
FIG. 4 illustrates a cross-sectional view of the portion of the semiconductor substrate of FIG. 2, including a representation of the initial molecular bonding structure at the surface of the tunnel dielectric layer.

In other embodiments, the nucleation of nanoclusters on the surface of the tunnel dielectric layer 14 can be improved by altering the surface bonding structure of the tunnel dielectric layer 14. FIG. 4 illustrates a cross-sectional view of the portion of the semiconductor substrate 10 following formation of the tunnel dielectric layer 14. The tunnel dielectric layer 14 in FIG. 4 is assumed to be silicon dioxide and the initial surface bonding structure 504 of the silicon dioxide is also illustrated. Note that each of the two silicon atoms within the silicon dioxide bonding structure 504 is bonded to a single oxygen atom. This bonding structure is generally less reactive to the silane precursor gas commonly used for silicon nanocluster formation.

Figure 5:
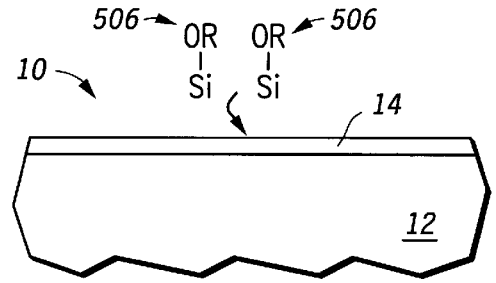
FIG. 5 illustrates a cross-sectional view of the portion of the semiconductor substrate of FIG. 4 following alteration of the molecular bonding structure at the surface of the tunnel dielectric layer in accordance with a particular embodiment of the present invention.

In order to alter the bonding structure of the top surface of the tunnel dielectric layer 14, a reactant gas species can be applied to the surface. For example, hydrofluoric acid (HF), which may be in liquid form or in vapor form, or other reagents can be applied to the surface of the tunnel dielectric layer 14 to alter the bonding structure such that the resulting surface bonding structure facilitates adsorption of silane, reduces the critical nucleus size, improves reaction byproduct desorption and therefore improves the nucleation of nanocrystals on the tunnel dielectric layer 14. FIG. 5 illustrates a cross-sectional view of the portion of the semiconductor substrate 10 where the bonding structure for the top portion or surface of tunnel dielectric layer 14 has been altered by exposure to a reagent. The bonding structure 506 illustrates individual silicon atoms bonded to an oxygen reactant pair where in the case of exposure to HF, the reactant (R) will be hydrogen (H) or fluorine (F). In other embodiments different reagents, or reactant gases, may be used in place of HF. Example reagents include gases such as germane, phosphine, diborane, ammonia, and water vapor. Thus, the reactant portion of the bonding structure 506 may be different materials, where the bonding structure 506 is more reactive to silane gas and therefore improves nucleation on the surface of the tunnel dielectric layer 14. Therefore, other similar reactant gases may be utilized to achieve the same alteration in bond structures as described with respect to FIG. 5. Reacting the surface portion of the tunnel dielectric 14 to alter the bonding structure can be achieved through wet etching operations or by performing an annealing process using a reactant gas at a temperature known to facilitate such bonding structure alteration.

Figure 6:
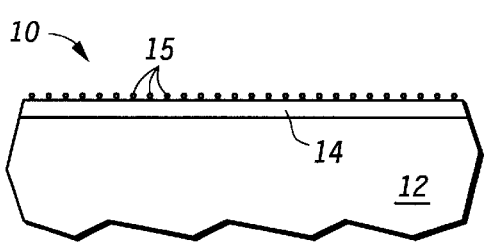
FIG. 6 illustrates a cross-sectional view of the portion of the semiconductor substrate of FIG. 2 where nanocluster nucleation has been initiated in accordance with a particular embodiment of the present invention.

FIG. 6 illustrates a cross-sectional view of the portion of the semiconductor substrate 10 as formed in FIG. 2 where nuclei 15, which eventually grow into nanoclusters, have begun to form. The time interval associated with FIG. 6 preferably corresponds to the nucleation phase 318 of the curve 312 illustrated in FIG. 1. Note that the surface of the tunnel dielectric layer 14 of FIG. 6 may have been treated using one or more of the methods described with respect to FIGS. 3–5 in order to facilitate nucleation. The nucleation shown to be occurring in FIG. 6 typically follows the incubation period described with respect to FIG. 1.

Growth of the nanoclusters is preferably performed using a CVD process, which may be an LPCVD process or a UHVCVD process. Such CVD processes typically occur within a controlled environment of a CVD chamber. CVD processes involve flowing a precursor gas into the chamber under controlled conditions such that molecules in the precursor gas adsorb on the surface of the substrate wafer and react to form the desired species. Typically undesired byproducts resulting from the CVD operation will desorb from the surface and exit the chamber.

In order to promote the growth of nanoclusters, which may be useful in the production of semiconductor memory devices such as EEPROMS, the nanoclusters are typically formed of semiconductor materials such as silicon, germanium, or silicon germanium alloy. In the case of silicon nanoclusters, the precursor gas utilized to form the silicon nanoclusters may be silane, disilane, or other silicon-containing gas. Such silicon-containing gases can be used to promote both initial nucleation and further growth of the nanoclusters until the desired density and size is obtained.

In order to promote nucleation, the conditions within the CVD chamber are closely controlled. A number of factors influence whether nucleation or growth occurs with respect to the nanoclusters being formed. In order to promote nucleation, the nature of the surface of the tunnel dielectric layer 14, the partial pressure the semiconductor-containing gas, the temperature within the chamber, and the presence and identity of any co-flow gases can be controlled. Parameters suitable for initial nucleation of silicon nanoclusters include a chamber temperature not exceeding 600° C., a silicon-containing gas flow rate that is greater than or equal to approximately 50 standard cubic centimeters per minute (SCCM), a partial pressure for the silicon-containing gas that is less than or equal to about 200 mTorr. Such conditions may be maintained for a time period that is greater than 30 seconds in order to allow incubation and initial nucleation to occur. Thus, after forming the tunnel dielectric layer 14 on the substrate 12, the substrate with the overlying tunnel dielectric layer 14 may be placed in a CVD chamber and heated to a temperature not exceeding 600 degrees Celsius at which point silicon nanoclusters may be formed by flowing gas as stated above. A temperature of 580 degrees Celsius using 100 per cent silane at 1000 SCCM for one minute has been found to be effective.

Although higher pressures accelerate silicon deposition, such high pressures can also result in a shortened time period for formation, which is undesirable for growth of nanoclusters. Therefore, additional lengthening of the time scale associated with growth of the nanoclusters can be achieved by reducing the partial pressure of the precursor gas. By combining lower pressures and lower temperatures, extended nucleation times can be obtained, thus furthering the control of such nucleation. A further benefit of decreased temperatures during nucleation is realized by the reduction of the critical size of the nuclei formed during the nucleation process. Therefore, fewer atoms must cluster together to form the critical size nuclei with lower temperatures than would be required to form such critical size nuclei at higher temperatures.

In some embodiments, the temperature within the chamber during nanocluster formation, may be between 500° and 600° C. Further reduction in temperature below 500° C. may result in reduction in the desorption rate of hydrogen from the surface of the semiconductor wafer during nanocluster formation. Such a reduction in the desorption rate of hydrogen can impede the nucleation process by blocking reactant sites which could be available for silicon-containing precursor adsorption.

Figure 7:
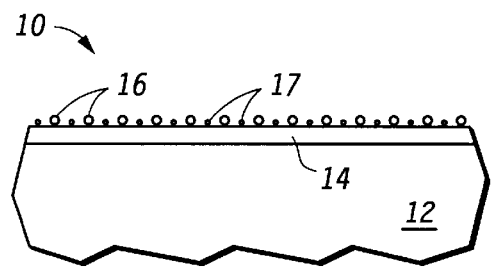
FIGS. 7–9 illustrate cross-sectional views of the portion of the semiconductor substrate of FIG. 6 at subsequent time intervals corresponding to the formation of the nanoclusters in accordance with a particular embodiment of the present invention.

FIG. 7 illustrates a cross-sectional view of the portion of the semiconductor substrate 10 as formed in FIG. 6 following additional nucleation and some growth of established nuclei. The established nuclei 16 have been shown to increase in size through the addition of subsequent atoms, whereas additional nuclei 17 may be forming during this intermediate stage between a first phase, where primarily nucleation is occurring, and a second phase, where primarily growth of established nuclei occurs.

Figure 8:
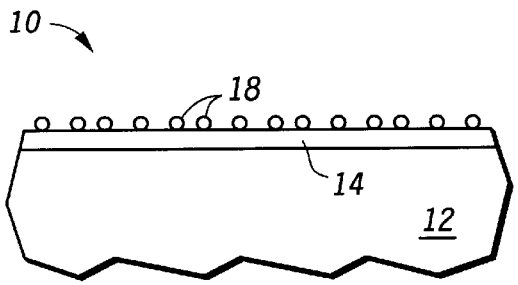

FIG. 8 illustrates a cross-sectional view of the portion of the semiconductor substrate 10 as formed in FIG. 7 where nucleation has generally ceased as the size and density of the established nuclei 18 has reached a point where atoms tend to join the established nuclei rather than generating new nuclei. Generally, the point at which such a changeover from nucleation to growth occurs can be controlled by variation of the process parameters such that the desired density of nanoclusters can be achieved. Once the desired density has been achieved, the conditions within the CVD chamber may be adapted to promote growth of the established nanoclusters 18.

The conditions that promote nanocluster growth may include lower partial pressure of the precursor gas, which may be a silicon-containing gas as described earlier. During the growth phase, the partial pressure of the silicon-containing gas may be reduced to a point where the partial pressure is less than or equal to 10 mTorr. An additional factor that may promote growth over nucleation is an increased temperature, as faster moving atoms are more likely attach to established nucleation sites rather than forming new nuclei. Decreased partial pressures of the silicon-containing gas causes fewer silicon atoms to form on the surface such that the growth rate of the nanoclusters can be closely controlled.

In LPCVD processes, co-flow gases are often employed in order to ensure process stability. However, such co-flow gases can inhibit the deposition of silicon and the growth of nanoclusters. For example, hydrogen is a common co-flow gas utilized in conjunction with silane. In the case where silicon is to be deposited on the surface of the wafer, the breakdown of the silane gas into silicon and hydrogen can be inhibited by a hydrogen co-flow gas, as the hydrogen by-product of the silane breakdown operation is prevented from desorbing from the surface of the wafer. Therefore, to promote the deposition of silicon required to induce both nucleation and growth, a gas mixture that includes inert co-flow gases, such as nitrogen or argon, along with a semiconductor-containing gas, such as silane or disilane, may be used to enhance silicon deposition on the wafer.

It should be noted that the reason hydrogen is commonly used as a co-flow gas with silane in other CVD operations is that it helps to prevent gas phase decomposition of silane into silicon and hydrogen. However, in the conditions present in the chamber as described for the growth of nanoclusters, the low partial pressure of the silane gas in combination with the low temperature inhibits such gaseous phase decomposition. As such, other inert gases may be utilized as co-flow gases in order to allow for LPCVD processes to succeed, without concern for gaseous phase decomposition of the silane gas.

In embodiments of the present invention in which UHVCVD is utilized for forming the nanoclusters, co-flow gases may not be required to promote the distribution of the silane or other semiconductor-containing gas within the chamber. As such, the semiconductor-containing gas may be present without any co-flow gases in the CVD chamber during UHVCVD nanocluster formation. Following the formation of the nanoclusters of the desired size and density, the semiconductor wafer is preferably kept in a non-oxidizing ambient to inhibit oxidation of the nanoclusters. Further steps can be taken to inhibit oxidation, such as encapsulation of the nanoclusters, which is described in additional detail with respect to FIGS. 21–27 below. A further step that can reduce the harmful effects of such oxidation is to allow the silicon nanoclusters to obtain their equilibrium shape, which may be a generally lens-like or hemispherical configuration as shown with respect to the nanoclusters 21 in FIG. 10. For example, the contact angle of molten silicon on a silicon dioxide tunnel dielectric layer is approximately 90°. As such, general shape of the nanoclusters may evolve to form the shape similar to that of the nanoclusters 21. The exact profile of the nanoclusters may be dependent on the wetting characteristics of the underlying tunnel dielectric layer 14. As such, pre-treating of the tunnel dielectric layer 14 may be performed to promote such wetting.

Figure 9:
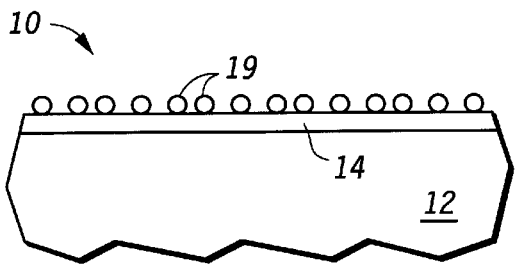

In the case of nanoclusters deposited through LPCVD operations, the general shape of the resulting nanocluster structures is more likely to be in a non-equilibrium configuration such as the configuration of the nanoclusters 19 in FIG. 9. In order to allow the nanoclusters deposited by LPCVD to obtain an equilibrium shape as indicated in FIG. 10, an annealing process may be utilized.

Figure 10:
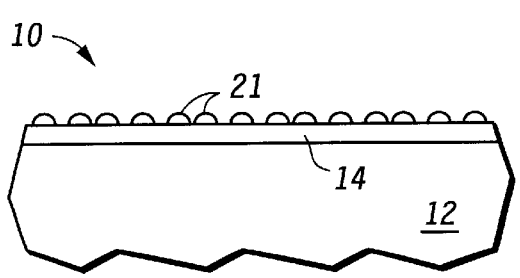
FIG. 10 illustrates a cross-sectional view of the semiconductor substrate portion of FIG. 9 where the nanoclusters have been partially or fully relaxed to equilibrium with the surface of the tunnel dielectric layer in accordance with a particular embodiment of the present invention.

In the case where the nanocluster structures are formed through UHVCVD operations, the extended time period associated with the formation of the nanoclusters may be sufficient to allow the nanoclusters to obtain the equilibrium shape illustrated in FIG. 10. If the time period is not sufficient, a similar annealing step may be utilized to promote the transition to the equilibrium configuration.

A desirable size of nanoclusters for use in semiconductor memory structures may be between 30 and 70 angstroms, and in some embodiments a target diameter of 50 angstroms may be appropriate. In an embodiment where 50-angstrom diameter nanoclusters are utilized, a density of greater than $5 \times 10^{11}$ nanoclusters per centimeter can be achieved using the formation techniques described herein. In such an embodiment, the coverage, or area density of the nanoclusters on the underlying tunnel dielectric layer may be approximately 20%. The 20% area density is reasonable for semiconductor device manufacturing, as it provides a level of tolerance in the spacing between the nanoclusters included in the floating gate structures. Although higher area densities may be achieved, the proximity of the isolated storage elements in such higher area density embodiments may increase the probability of lateral charge transfer between nanoclusters, thus degrading the beneficial effects of their isolation.

Figure 11:
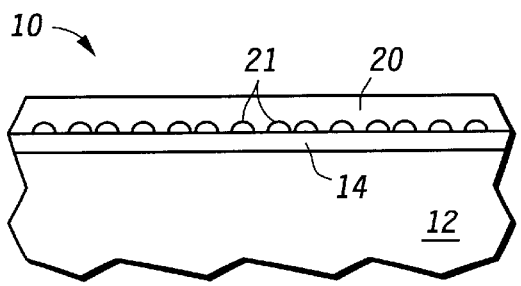
FIG. 11 illustrates a cross-sectional view of the semiconductor substrate portion of FIG. 10 upon which a control dielectric layer has been formed in accordance with a particular embodiment of the present invention.

FIG. 11 illustrates a cross-sectional view of the semiconductor substrate portion 10 of FIG. 10 upon which a control dielectric layer 20 has been formed. The control dielectric layer 20 overlies the nanoclusters 21 and the tunnel dielectric layer 14. The control dielectric layer 20 may be deposited using CVD, sputtering, or other deposition steps commonly used in semiconductor processing operations. The material included in the control dielectric layer 20 may be oxide-nitride-oxide (ONO), silicon oxide, or metal oxide. Prior to forming the control dielectric layer 20, each of the nanoclusters 21 may be encapsulated in order to prevent oxidation as described with respect to FIGS. 21–27 below.

Figure 12:
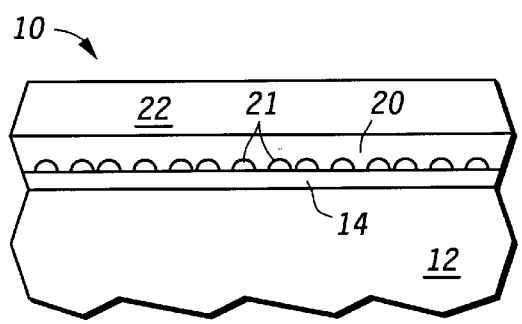
FIG. 12 illustrates a cross-sectional view of the semiconductor substrate portion of FIG. 11 upon which a gate material layer has been formed in accordance with a particular embodiment of the present invention.

FIG. 12 illustrates a cross-sectional view of the portion of the semiconductor substrate 10 of FIG. 11 where a conductive layer 22 has been deposited over the control dielectric layer 20. The conductive layer 22 is preferably a gate material such as doped polysilicon or metal. Deposition of the conductive layer 22 may be accomplished using CVD or other techniques commonly used to deposit such gate materials.

Figure 13:
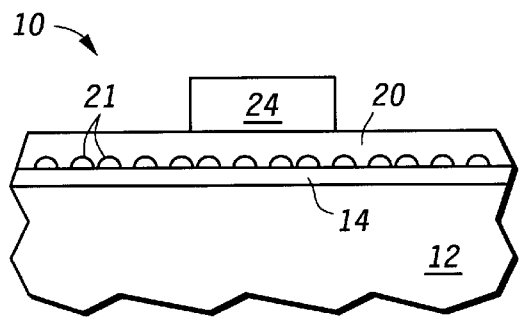
FIG. 13 illustrates a cross-sectional view of the semiconductor substrate portion of FIG. 12 where the gate material layer has been patterned to form a gate electrode in accordance with a particular embodiment of the present invention.

FIG. 13 illustrates a cross-sectional view of the semiconductor substrate portion 10 of FIG. 9 where a portion of the conductive layer 22 has been removed to form a gate, or gate electrode 24. Formation of the gate electrode 24 defines a channel region in the semiconductor layer 12 that underlies the gate electrode 24. Etching of the conductive layer 22 to form the gate electrode 24 may be accomplished using a reactive ion etch.

Figure 14:
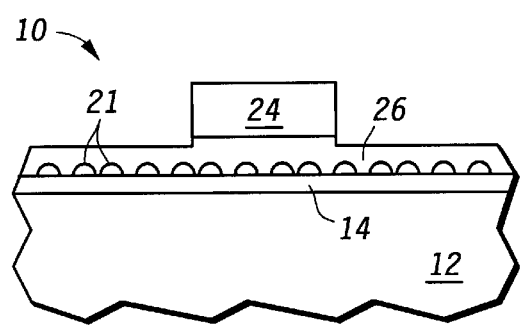
FIG. 14 illustrates a cross-sectional view of the semiconductor substrate portion of FIG. 13 where a portion of the control dielectric layer has been selectively removed in accordance with a particular embodiment of the present invention.

FIG. 14 illustrates a cross-sectional view of the semiconductor substrate portion 10 of FIG. 10 where a portion of the control dielectric layer 20 has been etched to form an etched control dielectric layer 26. The portion of the control dielectric layer 20 that is removed to form the etched control dielectric layer 26 is the portion that lies adjacent to (not below) the gate electrode 24. Thus, the portion of the control dielectric layer 20 that underlies the gate electrode 24 is not etched. Such etching may be performed using reactive ion etching (RIE).

Figure 15:
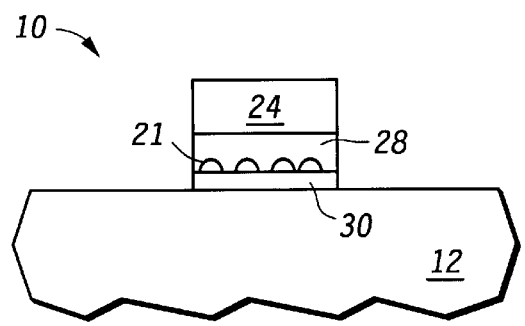
FIG. 15 illustrates a cross-sectional view of the semiconductor substrate portion of FIG. 14 after selective removal of portions of the tunnel dielectric layer, the plurality of nanoclusters, and the control dielectric layer in accordance with the particular embodiment of the present invention.

FIG. 15 illustrates a cross-sectional view of the substrate portion 10 of FIG. 14 where a portion of the plurality of nanoclusters 21 have been reacted to form a compound that has subsequently been removed through etching operations. The portion that is reacted is the portion that underlies the portion of the control dielectric layer 20 that was etched away to produce the etched control dielectric layer 26 illustrated in FIG. 14. Thus, the portion of the plurality of nanoclusters 21 that underlies the gate electrode 24 is generally unaffected by the reacting operation. Reacting may include reacting with oxygen, which creates silicon oxide in the case of silicon nanoclusters.

Following the reacting of the portion of the nanoclusters, the reacted portion may be removed along with a corresponding portion of the tunnel and control dielectric layers 14 and 26 using an etching operation. The etching operation may be a non-selective wet etch operation. For example, in the case of silicon nanoclusters, reacting a portion of the plurality of nanoclusters may include reacting those nanoclusters with oxygen to form silicon oxide. If the tunnel and control dielectric layers 14 and 26 are silicon oxide, a wet etch operation utilizing dilute hydrofluoric acid will achieve the desired results. What is shown to remain in the cross-sectional view of FIG. 15 is the gate electrode 24, a selected portion of the control dielectric layer 28, a portion of the nanoclusters 21, and a selected portion of the tunnel dielectric layer 30, all of which underlie the gate electrode 24.

Figure 16:
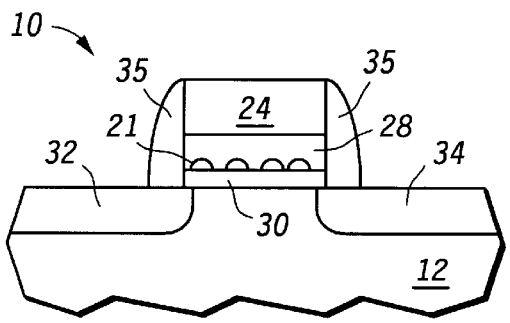
FIG. 16 illustrates a cross-sectional view of the semiconductor substrate portion of FIG. 15 where spacers, a source region, and a drain region have been formed for a semiconductor device in accordance with a particular embodiment of the present invention.

FIG. 16 illustrates a cross-sectional view of the semiconductor substrate 10 of FIG. 15 where spacers 35 and source and drain regions 32 and 34 have been formed to form a transistor structure (or at least a major portion thereof). The source and drain regions 32 and 34 may be formed through implantation of dopant materials in the seiconductor layer 12. Formation of the source and drain regions 32 and 34 results in the formation of the channel region that lies beneath the gate electrode 24 between the source and drain regions 32 and 34. Such a transistor structure may be produced to include field isolation regions (not shown) to isolate the transistor for neighboring devices.

Transistors such as that shown in FIG. 16 may be utilized in semiconductor memory structures such as flash memories, EEPROM memories, DRAM memories, or other memory structures of varying volatility. In particular, such a transistor structure may be useful in the production of flash memory structures that require charge retention characteristics such that the state of the transistor can be maintained for a time period on the order of years.

In order to simplify the reacting and etching away of the portion of the plurality of nanoclusters 21 as described with respect to FIGS. 14 and 15, the initial growth or deposition of nanoclusters can be controlled such that few or none of the nanoclusters need to be reacted and etched away. By simplifying the reaction and etching steps, manufacturing efficiency can be improved. In order to control the formation of nanoclusters such that higher concentrations of nanoclusters are achieved at desired locations, preferable growth regions can be formed on the tunnel dielectric layer 14. Such preferable growth regions correspond to areas on the tunnel dielectric layer 14 where surface modifications have been performed to facilitate nucleation of nanoclusters. Specifically, nitrogen-containing sections can be formed over different portions of the tunnel dielectric layer 14 where the nitrogen-containing sections promote higher nanocluster nucleation and growth. Due to the difference in incubation time associated with nanocluster development on nitrogen-containing material and the incubation time associated with the tunnel dielectric materials such as silicon dioxide, nanocluster nucleation and growth will preferentially occur on those nitrogen-containing sections overlying the tunnel dielectric layer 14.

Figure 17:
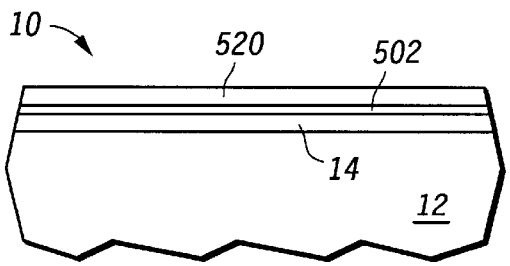
FIGS. 17–19 illustrate cross-sectional views of the semiconductor substrate portion of FIG. 3 after sequential steps used to form a nitrogen-containing layer section overlying the tunnel dielectric layer in accordance with a particular embodiment of the present invention.

FIGS. 17–20 illustrate cross-sectional views of the portion of the semiconductor substrate 10 corresponding to different steps in the selective formation of nanoclusters overlying the tunnel dielectric layer 14. FIG. 17 illustrates the portion of the semiconductor substrate 10 as illustrated in FIG. 3 following growth of a masking layer 520, which may be photoresist.

Figure 18:
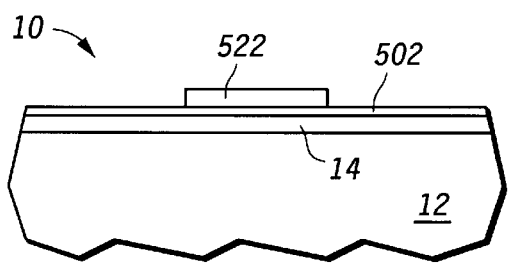

FIG. 18 illustrates a cross-sectional view of the portion of the semiconductor substrate 10 of FIG. 17 following a subsequent step during which the masking layer 520 is patterned to form a patterned masking layer 522. In the case of a photoresist masking layer, the patterning can be achieved by lithographic exposure of the photoresist followed by a lift-off operation. As such, a remaining portion 522 of the masking layer remains overlying the portion of the tunnel dielectric layer 14 corresponding to the area in which nanocluster growth is desired. Thus, masked and unmasked portions of the nitrogen-containing layer 502 remain after removal of the portion of the masking layer 520.

Figure 19:
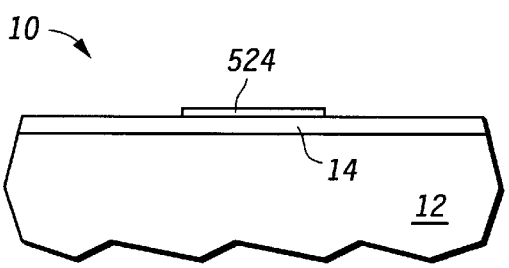

FIG. 19 illustrates a cross-sectional view of the semiconductor substrate portion 10 of FIG. 18 following subsequent processing steps where the remaining portion 522 of the masking layer has been removed along with those unmasked portions of the nitrogen-containing layer 502 (those portions not underlying the remaining portion 522 of the masking layer, which are considered the masked portions). The portion of the semiconductor substrate as illustrated in FIG. 18 may be anisotropically etched to first remove the unmasked portion of the nitrogen-containing layer that does not underlie the portion of the masking layer 522, and then the remaining portion 522 of the masking layer can also be removed to produce the resulting structure illustrated in FIG. 19. The structure illustrated in FIG. 19 includes a nitrogen-containing layer section 524 (masked portion of the nitrogen-containing layer) that corresponds to a location on the tunnel dielectric 14 where nanocluster growth is desired. Those portions of the tunnel dielectric 14 that do not have overlying nitrogen-containing layer sections correspond to areas where nanocluster growth is not desired.

Figure 20:
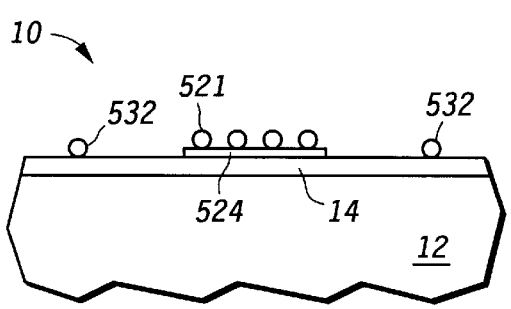
FIG. 20 illustrates a cross-sectional view of the semiconductor substrate portion of FIG. 19 following selective growth of nanoclusters in accordance with a particular embodiment of the present invention.

FIG. 20 illustrates the selective growth of nanoclusters on the structure illustrated in FIG. 19. As is illustrated, nanoclusters will preferentially grow on the nitrogen-containing layer section 524 such that a number of nanoclusters 521 will be formed thereon. However, due to the difference in incubation periods and less reactive nature of the tunnel dielectric layer 14, only a fractional set of corresponding nanoclusters 532 will be formed directly on the tunnel dielectric 14. Thus, when the operations are performed to remove the nanoclusters not underlying the gate region of the device, the number of nanoclusters that must be reacted and removed through etching operations is greatly reduced.

Figure 21:
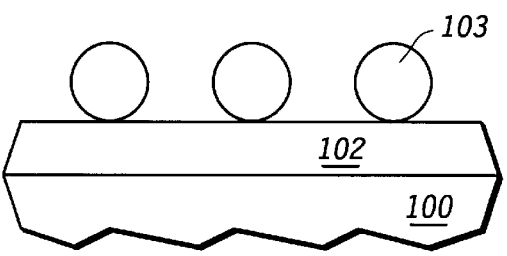
FIG. 21 illustrates an expanded cross-sectional view of a plurality of nanoclusters formed on a tunnel dielectric layer in accordance with a particular embodiment of the present invention.

FIG. 21 illustrates an expanded cross-sectional view of a plurality of nanoclusters 103 as formed on a tunnel dielectric layer 102. Following deposition of the nanoclusters 103 and the tunnel dielectric 102 on the semiconductor substrate 100, the substrate 100 may be exposed to ambient conditions. Such exposure to ambient conditions may result in oxidation of the nanoclusters 103 which in turn may result in a number of undesirable effects. One undesirable effect concerns the reduction in the effective size of the nanoclusters through the consumption of silicon or other composition materials during such oxidation. As a result, if too much oxidation occurs, the resulting size of the nanoclusters may be such that they are incapable of storing charge in the manner required to allow them to effectively function as charge storage elements. Smaller nanoclusters are less receptive to charge carriers due to reduced cross-sectional area as well as other factors. As such, higher programming voltages, longer programming times, and less effective programming may result from smaller nanoclusters that are less than 25 angstroms in diameter.

Another potential undesirable effect resulting from oxidation involves the increase in thickness of the tunnel dielectric layer 102, which can occur due to oxidation of either the nanoclusters 103 or the underlying substrate 100. Specifically, oxidation may occur at the interface between the nanoclusters 103 and the tunnel dielectric layer 102. Because the tunnel dielectric layer 102 is often formed of silicon oxide, and oxidation of silicon nanoclusters will result in additional silicon oxide, this effectively increases the thickness of the tunnel dielectric layer 102. Such an increase in thickness is undesirable as it can affect the overall electrical characteristics of the semiconductor device that includes the nanoclusters 103.

Figure 22:
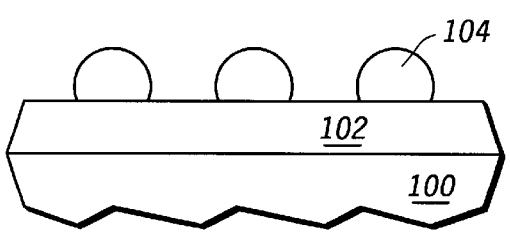
FIG. 22 illustrates an expanded cross-sectional view of the plurality of nanoclusters of FIG. 21 following partial or complete relaxation with the surface of the underlying tunnel dielectric layer in accordance with a particular embodiment of the Present invention.

In order to reduce or eliminate oxidation of the nanoclusters 103, a step subsequent to their formation that alters their general shape can be performed. FIG. 22 illustrates the nanoclusters as shown in FIG. 21 following a subsequent processing step that reconfigures the general shape of the nanoclusters 103 to form generally hemispherical nanoclusters 104. This alteration in nanocluster shape can be produced by an annealing step or other operations that allow the atoms in the nanoclusters to move to equilibrium with the underlying tunnel dielectric layer 102. Such a step was also described above with respect to FIG. 10. The resulting generally hemispherical nanoclusters 104 have a reduced amount of surface area that may be exposed to ambient conditions during subsequent processing steps. Furthermore, the diffusion of oxygen to portions of the nanoclusters 104 are in contact with the underlying tunnel dielectric 102 is reduced so that problems associated with increased tunnel dielectric thickness are generally avoided.

A further benefit of the generally-hemispherical nanoclusters 104 shown in FIG. 22 may be realized based on the increased surface area of the generally-hemispherical nanoclusters 104 in contact with the tunnel dielectric layer 102. The generally-hemispherical nanoclusters 104 provide an increased cross-sectional area for capturing charge carriers received from the underlying channel region of the device during programming operations.

Figure 23:
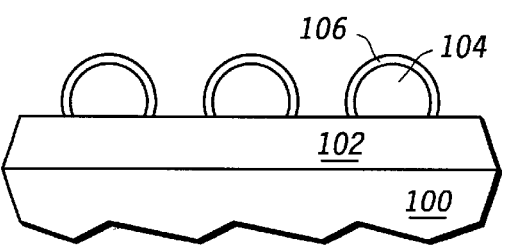
FIG. 23 illustrates an expanded cross-sectional view of the nanoclusters of FIG. 22 where the nanoclusters have been encapsulated in an encapsulation layer in accordance with a particular embodiment of the present invention.

Further processing steps can be performed in order to limit the oxidation or other degradation of the nanoclusters due to ambient exposure. FIG. 23 illustrates the nanocluster structures of FIG. 22 following an encapsulation step. The encapsulation step forms an encapsulation layer 106 on each of the nanoclusters 104. Such an encapsulation layer 106 may be formed of silicon nitride. Silicon nitride may be formed on the surface of the nanoclusters 104 by exposing the nanoclusters 104 to a nitriding ambient at high temperature. Such an ambient may include ammonia, nitrous oxide, or other nitrogen-containing compounds that are reactive to silicon in a manner that can be controlled. In one embodiment, a thin layer of nitride is formed on the nanoclusters by flowing ammonia, without other reactants, over the nanoclusters. The conditions under which the ammonia may be flowed may include a temperature within a typical range of 700–1000 degrees Celsius and a pressure within a typical range of 1–760 Torr.

It should be noted that the encapsulation techniques described with respect to FIGS. 21–27 are also applicable to preformed nanoclusters that have been deposited on the surface of the tunnel dielectric layer in accordance with the teachings of the co-pending patent application entitled "MEMORY DEVICE AND METHOD FOR USING PREFABRICATED ISOLATED STORAGE ELEMENTS" which is referenced and incorporated above.

Preferably, the formation of the encapsulation layer 106 can be controlled such that the thickness of the encapsulation layer 106 is on the order of 5 angstroms, or no greater than 10% of the diameter of the nanoclusters 104. In the case where the nanoclusters 104 are silicon nanoclusters, the nitriding process used to create the encapsulating layer 106 is typically self-limiting. Thus, in a controlled environment, the maximum growth of silicon nitride on the silicon nanoclusters 104 may be self-limited with respect to the temperature of nitridation.

Typically, the nitriding ambient used for forming the encapsulation layer 106 does not affect the underlying tunnel dielectric layer 102 in a significant manner. As such, the nitriding step utilized to form the encapsulation layer 106 will not result in nitridation of the underlying tunnel dielectric layer 102. As such, traps that may be generated within the encapsulation layer 106 are isolated from the underlying substrate 100 as well as from the encapsulation layers of neighboring nanoclusters. As such, trap assisted leakage between the nanoclusters is less likely to occur. This lack of degradation of charges stored in the traps may actually enhance the charge storage characteristics of the nanoclusters 104.

Figure 24:
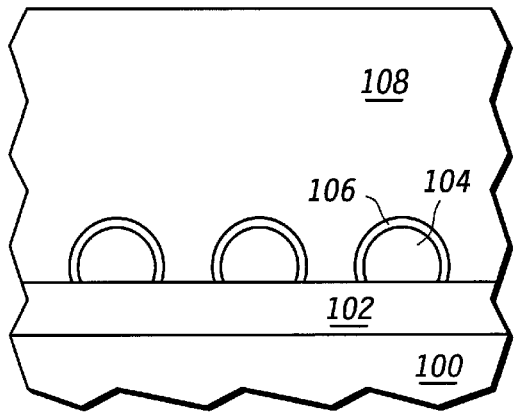
FIG. 24 illustrates an expanded cross-sectional view of the structure of FIG. 23 where a control dielectric layer has been formed overlying the tunnel dielectric layer and the encapsulated nanoclusters in accordance with a particular embodiment of the present invention.

FIG. 24 illustrates the portion of the semiconductor substrate of FIG. 23 following deposition of the control dielectric layer 108. In prior art systems that did not include the encapsulation of the nanoclusters 104 with an encapsulation layer 106, the formation of the control dielectric layer 108 could result in oxidizing ambient exposure of the nanoclusters 104 such that oxidation occurs. By including the encapsulation layer 106, oxidation or other degradation due to oxidizing ambient exposure of the nanoclusters 104 can be reduced or eliminated. As such, the diameter of the nanoclusters 104 is maintained, and no uncontrolled increase in the underlying tunnel dielectric occurs.

Figure 25:
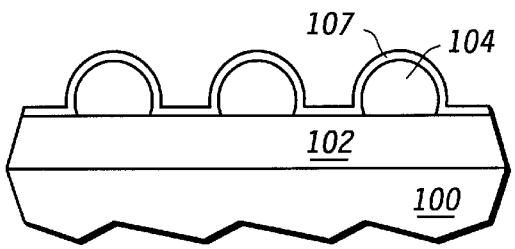
FIG. 25 illustrates an expanded cross-sectional view of the nanoclusters of FIG. 22 following formation of a thin dielectric layer overlying the plurality of nanoclusters in accordance with a particular embodiment of the present invention.

In other embodiments, a protecting nitride layer may be deposited rather than grown on individual nanoclusters. FIG. 25 illustrates the nanocluster structures as shown in FIG. 22 following a step where a thin nitride layer 107 is deposited. The nitride layer 107 may be deposited using CVD operations that utilize ammonia and dichlorosilane. Such CVD operations may be performed using LPCVD or UHVCVD techniques. The deposition of the thin nitride layer 107 is preferably controlled such that the thickness of the thin nitride layer 107 is limited. A desirable thickness for the thin nitride layer 107 may be on the order of 5 angstroms. Such a limited thickness of nitride may limit or eliminate the potential for traps that may degrade the charge storage characteristics of semiconductor device being manufactured.

The thin nitride layer 107 illustrated in FIG. 25 forms a barrier to oxygen such that both the nanoclusters 104 and the underlying semiconductor substrate 100 below the tunnel dielectric layer 102 are protected from oxidation. As such, the potential for an increase in the thickness of the tunnel dielectric layer 102 is reduced.

Figure 26:
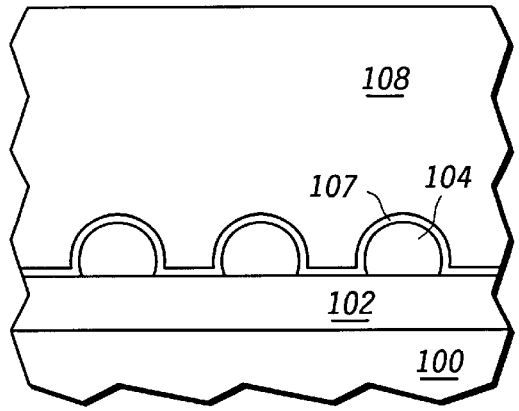
FIG. 26 illustrates an expanded cross-sectional view of the structure of FIG. 25 following formation of a control dielectric layer overlying the thin dielectric layer in accordance with a particular embodiment of the present invention.

FIG. 26 illustrates the portion of the semiconductor substrate of FIG. 25 following the formation of the control dielectric layer 108. During formation of the control dielectric layer 108, the thin dielectric layer 107 prevents oxidation of the nanoclusters 104 and may also serve to eliminate the potential for uncontrolled increase of the thickness of the tunnel dielectric 102.

In other embodiments, the control dielectric layer 108 may be formed of a high dielectric (high K) material that does not require high concentrations of oxygen for formation. As such, oxidation of the nanoclusters is less likely to occur. Control dielectrics that include metal oxide do not require the high concentrations of oxygen for growth that silicon oxide control dielectrics require. As such, there is less likelihood of degradation of the nanocluster structures. The high dielectric constants associated with metal oxide also serve to reduce the required programming voltages in comparison with silicon oxide control dielectrics. Metal oxides such as zirconium oxide, hafnium oxide, zirconium silicate, hafnium silicate, lanthanum aluminate, alumina, and strontium titanate may be used as the control dielectric.

Figure 27:
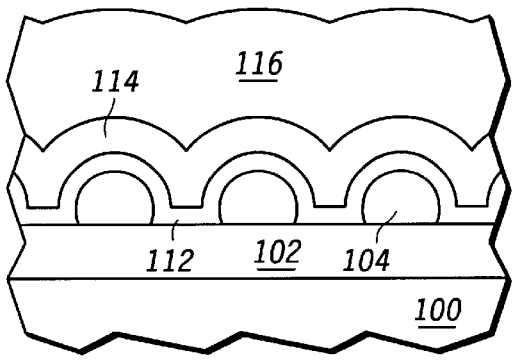
FIG. 27 illustrates an expanded cross-sectional view of the structure of FIG. 22 following formation of a multi-layered control dielectric overlying the plurality of nanoclusters.

Another technique that can be used for protecting the nanoclusters 104 and underlying semiconductor substrate 100 from oxidation or other degradation may be accomplished by dividing the formation of the control dielectric layer into a number of steps. FIG. 27 illustrates the semiconductor substrate portion of FIG. 22 following such processing steps.

Initially, a thin layer of high-quality silicon oxide 112 is formed over the nanoclusters 104 and underlying tunnel dielectric 102. Deposition of the thin high quality silicon oxide layer 112 may result in a small amount of oxidation of the nanoclusters 104. However, the thickness of the thin layer of high-quality silicon oxide layer 112 is preferably limited such that the time required for such deposition is limited. Because the time period for the deposition is limited, the degradation of the nanoclusters 104 is also limited to a tolerable amount. In one embodiment, the thin layer of high-quality silicon oxide 112 is formed to be approximately 13 angstroms thick.

Subsequent to formation of the thin layer of high-quality silicon oxide 112, a silicon-rich silicon oxide layer 114 is formed overlying the thin layer of high-quality silicon oxide 112. The silicon-rich silicon oxide layer 114 includes silicon atoms that may readily bond with oxygen atoms introduced through exposure to oxidizing conditions. As such, oxygen atoms attempting to migrate through the silicon-rich silicon oxide layer 114 and combine with silicon atoms in the nanoclusters 104 are captured by the silicon atoms, thus preventing degradation of the nanoclusters 104 as well as the underlying semiconductor substrate material 100.

In one embodiment, the silicon-rich silicon oxide layer 114 includes approximately 1% to 2% non-stoichiometric silicon (excess silicon). The thickness of the silicon-rich silicon oxide layer 114 may be on the order of 20–25 angstroms. It should be noted that this thickness can be altered in order to provide adequate protection for the underlying nanoclusters 104 based on the ambient to which the substrate may be exposed.

The thickness of the silicon-rich silicon oxide layer 114 may be determined based on the potential oxidation that may occur during subsequent processing steps as well as the amount of excess silicon included within the material used to form the silicon-rich silicon oxide layer 114. Thus, a trade off exists between the concentration of excess silicon within this layer and the degree of oxidation expected to occur during subsequent processing steps. It is desirable to ensure that the majority of the excess silicon within the silicon rich silicon oxide layer 114 combines with oxygen atoms to ensure that the conductive qualities of the silicon rich silicon oxide layer 114 are eliminated.

Following deposition of the silicon-rich silicon oxide layer 114, the remainder of the control dielectric layer can be formed through the growth of an additional high-quality silicon oxide layer 116 overlying the previously formed layers. Growth of the overlying high-quality silicon oxide layer 116 typically exposes the remaining portions of the structure to ambient conditions. However, as stated above, the silicon-rich silicon oxide layer 114 helps to prevent the oxidation of the nanoclusters 104 during such ambient exposure. The overlying high-quality silicon oxide layer 116 may be formed through CVD operations such as those described for other deposition steps above. The thickness of the overlying high-quality silicon oxide layer 116 may be on the order of 65 angstroms, or may be determined in order to provide a total control dielectric layer thickness of approximately 100 angstroms.

It should be noted that the encapsulation technique described with respect to FIGS. 23 and 24, the protective layer technique described with respect to FIGS. 25 and 26, the technique for inclusion of a silicon-rich oxide layer as described with respect to FIG. 27, and the use of alternate control gate dielectrics such as metal oxides may be used in conjunction with nanoclusters that are both spherical or hemispherical. As such, although the FIGs. illustrate encapsulation, layering, etc. with respect to generally-hemispherical nanoclusters, it is apparent to one of ordinary skill in the art that such techniques would also benefit spherical nanoclusters or nanoclusters of other shapes.

Furthermore, as is apparent to one of ordinary skill in the art, various combinations of the techniques described above may be useful in protecting the nanoclusters and underlying substrate from degradation resulting from exposure to oxidizing or other ambient conditions.

Figure 28:
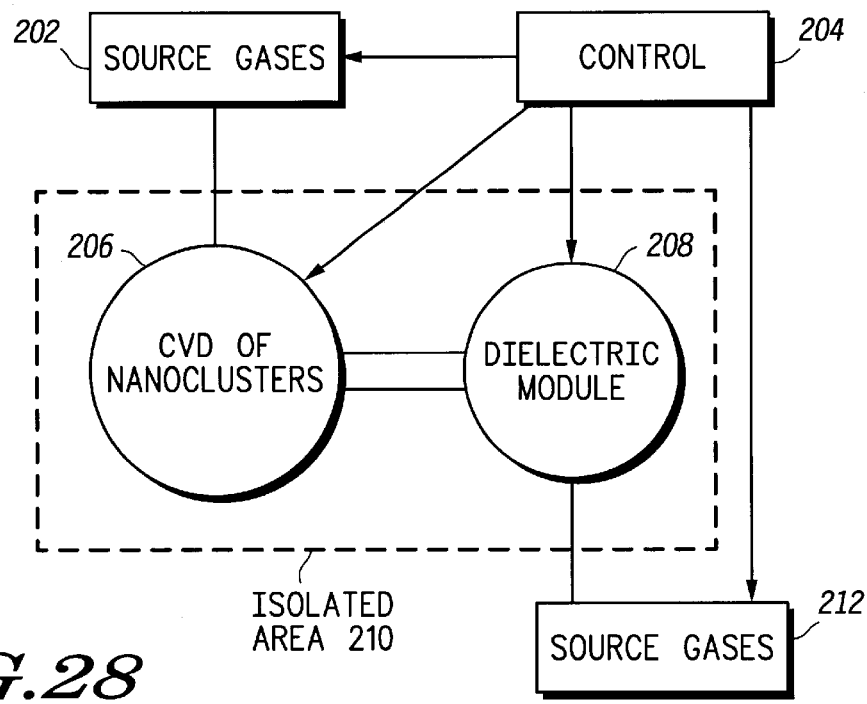
FIG. 28 illustrates a schematic diagram of a processing apparatus for forming a tunnel dielectric layer, a plurality of nanoclusters overlying the tunnel dielectric layer, and a portion or the entirety of an overlying control dielectric in accordance with a particular embodiment of the present invention.

In order to further promote the optimizations and control for the techniques described herein, the formation of the tunnel dielectric layer, the nanoclusters, and the control dielectric layer may all be accomplished within a controlled environment that does not expose the substrate wafer to ambient conditions during and between these processing steps. Such a controlled environment is schematically illustrated in FIG. 28, which may represent a cluster tool. As is shown in FIG. 28, a dielectric module 208 may be used for growth or deposition of the tunnel dielectric layer and also for formation of the control dielectric layer following formation of the nanoclusters on the surface of the tunnel dielectric layer. As is illustrated, the dielectric module 208 is included in an isolated area 210 along with the module 206 that controls the CVD of the nanoclusters. Preferably, the isolated area 210 provides a controlled environment, such as a near vacuum environment, and the transfer of the semiconductor substrate wafers between the dielectric module 208 and the CVD module 206 occurs without exposure to ambient conditions. In other words, the substrate upon which the nanoclusters are formed is continuously within the controlled environment of the cluster tool from the step of forming the tunnel dielectric until after the step of forming the nanoclusters.

The ability to perform all of these steps without the exposure to ambient conditions provides a number of benefits. Firstly, preventing the tunnel dielectric layer from exposure to ambient conditions reduces the chance of contaminants forming on the tunnel dielectric layer. Such contaminants can adversely affect the nucleation and growth of nanoclusters, and therefore any reduction in such contaminants is highly desirable.

Secondly, by preventing the nanoclusters from being exposed to ambient conditions, degradation of the nanoclusters due to oxidation is avoided. Therefore, following the nanocluster formation, passivation through nitridation as described above can occur immediately such that integrity of the nanoclusters is ensured.

A control module 204 controls the dielectric growth within the dielectric module 208 and the nanocluster growth within the nanocluster growth module 206. Such control may include regulation of source gases 202 and 212 such that desired flow rates and pressures are achieved. Other control may include regulation of temperature within the isolated area 210.

The present invention provides techniques useful in forming nanocluster structures using LPCVD and UHCVD deposition techniques. Utilization of the techniques described herein allows for high densities of nanoclusters to be achieved while maintaining process controllability. Such controllability allows the size, distribution, and general uniformity of the nanoclusters to be closely regulated such that the desired electrical characteristics for devices that include nanocluster floating gate structures can be achieved. As such, devices can be produced that include very thin tunnel dielectric layers such that low-power and high-speed operation can be achieved.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a storage device, comprising the steps of:
   providing a substrate;
   forming a tunnel dielectric over the substrate;
   forming nanoclusters over the tunnel dielectric;
   forming a thin layer of nitride on the nanoclusters;
   forming a control dielectric layer over the nanoclusters; and
   forming a conductive layer over the control dielectric layer.

2. The method of claim 1, wherein the thin layer of nitride is formed by flowing at least one of ammonia, $N_2O$, and NO, without other reactants, over the nanoclusters.

3. The method of claim 2, wherein the control dielectric layer includes at least one of zirconium oxide, hafnium oxide, aluminum oxide, lanthanum oxide, silicon-rich silicon oxide, and titanium oxide.

4. The method of claim 2, wherein the nanocrystals are hemispherical.

5. The method of claim 2, wherein forming the control dielectric layer further comprises:
   forming a thin oxide layer;
   forming a silicon-rich oxide layer on the thin oxide layer; and
   forming an additional oxide layer on the silicon rich oxide layer.

6. A method of forming a storage device, comprising the steps of:
   providing a substrate;
   forming a tunnel dielectric over the substrate;
   forming nanoclusters over the tunnel dielectric;
   depositing a first layer of oxide over the nanoclusters and the tunnel dielectric;
   depositing a silicon-rich oxide layer over the first layer of oxide;
   depositing a second layer of oxide over the silicon-rich oxide layer; and
   depositing a conductive layer over the second layer of oxide.

7. The method of claim 6, wherein thickness of the first layer of oxide is less than twenty angstroms.

8. The method of claim 6, wherein the nanoclusters are substantially hemispherical in shape.

9. The method of claim 6, further comprising the step of nitriding a surface of the nanoclusters without nitriding the tunnel dielectric.

10. The method of claim 9, wherein the step of nitriding further comprises flowing at least one of ammonia, $N_2O$, and NO, without other reactants, over the nanoclusters.

11. The method of claim 10, wherein the step of flowing occurs at a temperature within a range of 700–1000 degrees Celsius and at a pressure within a pressure range of 1–760 Torr.

12. The method of claim 6, further comprising the step of depositing nitride on the nanoclusters and on portions of the tunnel dielectric between the nanoclusters.

13. A method of forming a storage device, comprising the steps of:

provaning a substrate;

forming a tunnel dielectric over the substrate;

forming nanoclusters over the tunnel dielectric;

forming a control dielectric over the nanoclusters, wherein the control dielectric includes at least one of zirconium oxide, hafnium oxide, aluminum oxide, lanthanum oxide, silicon-rich silicon oxide, and titanium oxide; and forming a conductive layer over the control dielectric.

14. The method of claim 13, wherein the nanoclusters are substantially hemispherical in shape.

15. The method of claim 13, further comprising the step of nitriding a surface of the nanoclusters without nitriding the tunnel dielectric.

16. The method of claim 15, wherein the step of nitriding further comprises flowing at least one of ammonia, $N_2O$, and NO, without other reactants, over the nanoclusters.

17. The method of claim 13, further comprising the step of depositing nitride on the nanoclusters and on portions of the tunnel dielectric between the nanoclusters.

* * * * *